US010891946B2

(12) United States Patent
Pechanec et al.

(10) Patent No.: US 10,891,946 B2
(45) Date of Patent: Jan. 12, 2021

(54) VOICE-CONTROLLED ASSISTANT VOLUME CONTROL

(71) Applicant: Red Hat, Inc., Raleigh, NC (US)

(72) Inventors: Jiri Pechanec, Mokra-Horakov (CZ); Martin Vecera, Brno (CZ)

(73) Assignee: Red Hat, Inc., Raleigh, NC (US)

( * ) Notice: Subject to any disclaimer, the term of this patent is extended or adjusted under 35 U.S.C. 154(b) by 0 days.

(21) Appl. No.: 15/221,869

(22) Filed: Jul. 28, 2016

(65) Prior Publication Data

US 2018/0033424 A1 Feb. 1, 2018

(51) Int. Cl.
*G10L 15/22* (2006.01)
*G10L 21/0364* (2013.01)

(52) U.S. Cl.
CPC .......... *G10L 15/22* (2013.01); *G10L 21/0364* (2013.01); *G10L 2015/225* (2013.01)

(58) Field of Classification Search
CPC ........... H04M 19/044; H04M 1/72569; H04M 2250/12; G10L 15/20; G10L 21/0272; G10L 25/84; G10L 13/033; G10L 15/22; G10L 15/1822; G10L 2015/223; G10L 2015/225; G10L 21/0364; G10L 25/87; H03G 3/32; H03G 3/02; H03G 3/3005
See application file for complete search history.

(56) References Cited

U.S. PATENT DOCUMENTS

| 5,732,390 | A | 3/1998 | Katayanagi et al. | |
| 5,771,297 | A * | 6/1998 | Richardson | H04R 3/002 |
| | | | | 381/108 |
| 6,125,288 | A | 9/2000 | Imai | |
| 6,988,068 | B2 * | 1/2006 | Fado | H03G 3/32 |
| | | | | 704/225 |
| 7,139,393 | B1 | 11/2006 | Murase | |
| 7,392,066 | B2 | 6/2008 | Haparnas | |
| 7,908,134 | B1 * | 3/2011 | Felber | H03G 3/32 |
| | | | | 704/205 |
| 8,284,960 | B2 | 10/2012 | Vaudrey et al. | |
| 8,600,743 | B2 | 12/2013 | Lindahl et al. | |
| 8,639,516 | B2 | 1/2014 | Lindahl et al. | |
| 9,077,814 | B2 | 7/2015 | Lorello | |
| 2004/0193422 | A1 * | 9/2004 | Fado | G10L 13/033 |
| | | | | 704/260 |
| 2012/0245933 | A1 | 9/2012 | Flaks et al. | |
| 2014/0294191 | A1 * | 10/2014 | Parkins | A61F 11/06 |
| | | | | 381/72 |

(Continued)

OTHER PUBLICATIONS

Jan Vanus, et al; "Testing of the Voice Communication in Smart Home Care", Human-centric Computing and Information Sciences, http://hcis-journal.springeropen.com/articles/10.1186/s13673-015-0035-0, Jul. 15, 2015.

(Continued)

*Primary Examiner* — Angela A Armstrong
(74) *Attorney, Agent, or Firm* — Womble Bond Dickinson (US) LLP

(57) ABSTRACT

A method includes receiving a voice command, determining, by a processing device, a first loudness parameter associated with the voice command, generating a voice response to the voice command, and determining a target loudness parameter associated with the voice response in view of the first loudness parameter associated with the voice command.

12 Claims, 5 Drawing Sheets

(56) References Cited

U.S. PATENT DOCUMENTS

2014/0372109 A1* 12/2014 Iyer .................... H03G 3/32
704/225
2016/0316306 A1* 10/2016 Nooralahiyan ......... G06F 3/162

OTHER PUBLICATIONS http://www.alango.com/technologies-avq.php, "AVQ—Automatic Volume and eQualization Control", Alango Technologies.

* cited by examiner

US 10,891,946 B2

VOICE-CONTROLLED ASSISTANT VOLUME CONTROL

TECHNICAL FIELD

The present disclosure is generally related to voice-controlled assistant software applications ("voice-controlled assistants"), and is more specifically related to controlling the volume of the voice responses generated by the voice-controlled assistants.

BACKGROUND

A smart assistant (or an intelligent personal assistant) is a computer program that acts on behalf of a human user to perform certain tasks or services related to the human user. These tasks or services can be produced in response to user input, user location, and resources available to the smart assistant. Typically, after performing these tasks, the smart assistant generates a response, sometime in the form of a voice response, to the user.

BRIEF DESCRIPTION OF THE DRAWINGS

The present disclosure is illustrated by way of examples, and not by way of limitation, and may be more fully understood with references to the following detailed description when considered in connection with the figures, in which.

DETAILED DESCRIPTION

Figure 1:
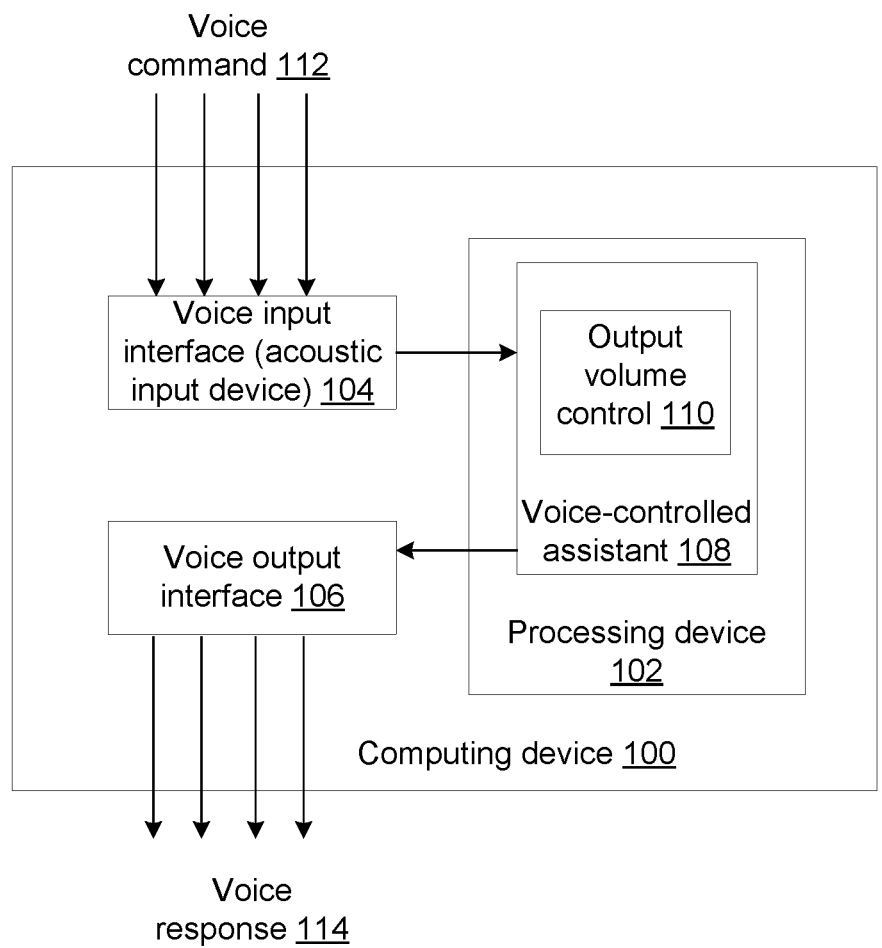
FIG. 1 illustrates a computing device implementing a voice-controlled assistant according to an implementation of the present disclosure.

One way to control a smart assistant is to use a voice command in the form of natural language and receive a voice response from the smart assistant. One problem associated with the voice response is how to set the loudness of the voice response. For example, when a user sets an alarm right before switching off the light and there is already someone sleeping nearby, a high volume voice response may be inappropriate. Embodiments of the present disclosure provides a technical solution that measures the loudness of the voice command to the smart assistant and sets the loudness of the voice response not exceeding that of the voice command.

Smart assistants can be implemented on computing devices including mobile devices such as, for example, smart phones that may be used in indoor or outdoor environments. The computing devices may include a processing device (e.g., a central processing unit (CPU)), input user interfaces (e.g., keyboard, mouse, touch screen, and/or voice command), and output user interfaces (e.g., display screen and/or voice output). A user of the smart assistant may, via the input user interfaces, issue a command to the smart assistant. The command may start execution of the smart assistant or transmit a request to the smart assistant to perform certain tasks or services on behalf of the user. Examples of the tasks or services may include schedule management (e.g., sending a notice to a meeting host that the user is running late due to traffic) and personal health management (e.g., monitor biological measurements such as, for example, heart beats). The processing device may execute the smart assistant program and responsive to receiving the command, perform the requested tasks or services. After performing or partially performing the requested tasks or services, the smart assistant may generate a response and provide, via the output user interfaces associated with the computing device, to the user.

A smart assistant that can be controlled via voice command is referred to as a voice-controlled assistant. The user may speak to the mobile device in natural languages (e.g., English) to issue his or her commands to the voice-controlled assistant. The voice commands may include a prompt (or activation command) to start the interactions with the voice-controlled assistant (e.g., "Hey Assistant") or commands for particular tasks (e.g., "I need to know the closest Italian restaurants"). The voice-controlled assistant may employ a dialogue system including a speech recognizer to analyze the voice command and determine the requested tasks or services. The voice-controlled assistant may perform the tasks or services specified by the user (e.g., identifying the closest Italian restaurant with respect to the user location) and generate a response for the user. Since the user request is in the form of voice commands, the voice-controlled assistant may present the response in voice responses (e.g., "The closest restaurant is the Frank's Pizza on $57^{th}$ street. Do you need directions?") generated using a speech synthesizer. The voice responses generated by the output user interface are associated with a loudness parameter. The loudness parameter may determine how loud the voice response should be presented to the user. Certain situations such as, for example, setting an alarm by a user in a room that has other people sleeping, may require that the volume of the voice responses to be set at a level below a certain threshold (e.g., less than 10 dB). The threshold may be set as not exceeding the loudness of the user's activation command. Implementations of the present disclosure provides technical solutions to determine the volume of the voice responses generated by a voice-controlled assistant in view of the loudness of the initial activation command issued by the user.

FIG. 1 illustrates a computing device 100 implementing a voice-controlled assistant 108 according to an implementation of the present disclosure. Computing device 100 can be a smart phone (e.g., an iPhone or an Android-based smart phone). Further, computing device 100 may include a processing device such as, for example, a central processing unit (CPU) that may execute the program code of software applications. Computing device 100 may also include storage devices such as, for example, a memory (not shown) and/or hard disks that may store the program code of these software applications. In one implementation, computing device 100 may connect to the Internet to receive data such as, for example, information relating to the user's request from the Internet.

The software applications running on processing device 102 may include a smart assistant application ("voice-controlled assistant") 108. Voice-controlled assistant 108 may receive voice commands 112 including requests from a user and process the requests to generate voice responses 114 to the user. In one implementation, the computing device 100 may include a voice input interface 104 to receive the sound signals of voice commands 112 and determine parameters (e.g., loudness parameters) associated with voice commands 112 and the content of voice commands 112 in a machine-readable format (e.g., a strings of alphanumeric characters). Voice input interface 104 may include an acoustic signal input device (e.g., a microphone to receive sound and convert the sound to electronic signals). Voice-controlled assistant 108 may receive and process the parameters and contents associated with voice commands 112. In one implementation, the parameters may include a measurement of the loudness of the background noise and a measurement of the loudness of the voice command 112 issued by the user.

In one implementation, voice-controlled assistant 108 may analyze the contents associated with voice commands to identify the tasks requested by the user. Further, voice-controlled assistant 108 may perform certain tasks (e.g., initiate a call to a contact or schedule an appointment with a doctor office) according the requests from the user. Responsive to completing the tasks, voice-controlled assistant 108 may further generate a response to the user. The response may be in the machine-readable format (e.g., the string of characters) that needs to be converted into voice responses 114. Computing device 100 may include a voice output interface 106 that may receive the response from voice-controlled assistant 108 and convert the response into a sound signal of voice responses 114 presented to the user.

Voice responses 114 presented to the user may be associated with a loudness parameter that determines the loudness of voice response 114. In one implementation, voice-controlled assistant 108 may include output volume control component 110 to determine the loudness parameter associated voice responses 114 in view of the measurement of the background noise and the measurement of the sound volume of the voice command 112. Voice output interface 106 may include an electronic device (e.g., an amplifier) that may control the volume of the voice response 114 according to the loudness parameter determined by output volume control 110. In one implementation, output volume control 110 may generate a target output volume that is no higher than the sound pressure of the voice command.

Figure 2:
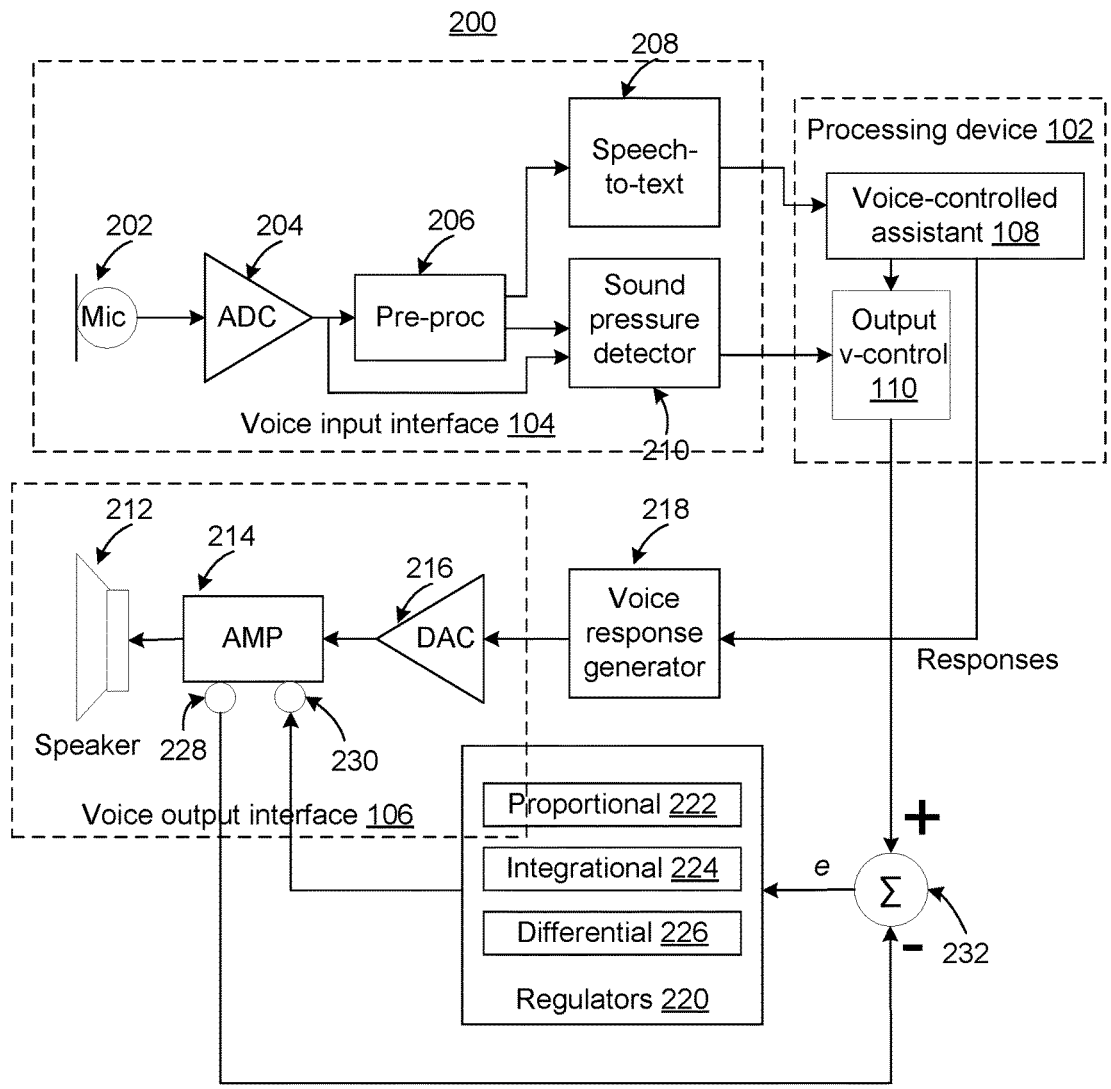
FIG. 2 illustrates a detailed system that controls the sound volume of voice response according to an implementation of the present disclosure.

FIG. 2 illustrates a detailed system 200 that controls the sound volume of voice response according to an implementation of the present disclosure. System 200 (e.g., the computing device as shown in FIG. 1) may include a processing device 102, a voice input interface 104, and a voice output interface 106.

In one implementation, computing device 100 may include a voice input interface 104 that further includes hardware components for receiving and converting the sound signal of user's voice commends into machine-readable format and for measuring parameters associated with the voice commands. As shown in FIG. 2, voice input interface 104 may further include a microphone 202, an analog-to-digital converter (ADC) 204, a pre-processing device 206, a processing device 208 to perform speech-to-text conversion, and a processing device 210 to measure parameters associated with the voice command.

Microphone 202 is a device utilized to convert the sound waves (e.g., sound waves of human speech and environmental noise) into electronic signals. Microphone 202 may include a sensing element (e.g., a diaphragm made of thin foil stretched like a drumhead over a frame) that may vibrate relative to a rigid back frame in response to pressures changes caused by sound waves. The vibration of the diaphragm relative to the back frame may change the capacitance between two electric poles that may generate the voltage changes (or the output electronic signal) between these two poles, thus converting the sound waves into electronic signals.

The output of microphone 202 includes analog electronic signals that vary continuously over time. To further process by a digital processing device (e.g., processing device 208, 210, 102), ADC 204 may convert the analog signals into digital signals which may include samples of the analog signals obtained at discrete points in time at a certain sampling frequency.

In one implementation, the digital signals may feed into a pre-processing device 206 for further processing. Pre-processing device 206 may prepare the digital signals for the calculation by voice-controlled assistant 108. For example, pre-processing device 206 may perform noise cancellation using the digital signals. The noise cancellation may separate and/or reduce different noise components in the sound signal received by the sensing elements in microphone 202. The noise can be microphone device noise, and any types of undesirable sound elements picked up by the sensing elements. Pre-processing device 206 may eliminate these undesirable components in the digital signals to generate a clean version of the digital signals.

The pre-processed digital signals may feed into processing device 208 that may perform speech-to-text conversion and feed into processing device 210 that may measure parameters associated with voice commands. In one implementation, processing device 208 and processing device 210 are two discrete, independent devices. In another implementation, processing device 208 and processing device 210 may be one processing device, or even part of processing device 102.

Processing device 208 may execute software applications such as, for example, a speech recognizer that may convert the digital signal of the voice commands issued by the user into a stream of alphanumeric symbols encoding one or more words of a natural language. These alphabets and numbers may feed into voice-controlled assistant 108 that may determine the requests by the user and perform tasks relating to these requests. For example, voice-controlled assistant may analyze the stream of symbols using a keyword spotting (or any suitable text analysis programs) to determine the tasks requested by the user.

Processing device 210 may also receive the clean digital signals from pre-processing device 206 and execute software applications (e.g., "sound pressure detector") that, when executed, measure sound pressures of sound waves received by sensing elements of microphone 202. The sound pressure may be calculated as a function of the power of the signal (i.e., the sum of the square values of the signal over a period of time) in the following manner. The sound pressure is a measurement of sound strength (relating to the loudness of the sound waves) on a scale (e.g., logarithmic scale). In one implementation, the sound pressure (P) may be expressed as a root mean squared (RMS) average over a pre-specified period of time (e.g., a fixed-length time window). For example, the sound pressure may be measured as $L=20 \log(P_{rms}/P_{reference})$ in decibels (dB), where $P_{reference}$ is a reference value for sound in the air.

In one implementation, sound pressure detector executing on processing device 210 may measure the sound pressure generated by background noise ($P_{bg}$) and sound pressure generated by user speech ($P_{us}$) separately. Sound pressure detector may separate sound pressure due to background noise and sound pressure due to user speech based on a frequency analysis because the background noise is mostly a broad spectrum white noise and user speech is mostly concentrated in frequency bands of human speech signals. In one implementation, sound pressure detector 210 may receive the raw digital signal from ADC 204 and the pre-processed digital signal from 206, and calculate the sound pressure due to the background noise by subtracting the pre-processed digital signal from the raw digital signal. Thus, sound pressure detector may generate a first measurement of the sound pressure of the background noise, and a second measurement of the sound pressure of user speech.

In one implementation, the sound pressure detector executing on processing device 210 may further identify the activation command in the voice commands issued by the user. The activation command is a verbal phrase that the user employs to notify the voice-controlled assistant to begin a dialog session. Example of the activation command may include "Hey Assistant." In one implementation, a text analyzer may be employed to identify the activation command. The text analyzer may parse the natural language text generated by speech-to-text program 208 against a pre-defined syntax. The activation command can be identified when a text phrase matches the pre-defined syntax. Responsive to detecting the activation command, the sound pressure detector may measure the sound pressure, representing the loudness of the activation command issued by a user. The sound pressure of the activation command may be used to determine the volume of the voice response generated by the voice-controlled assistant. As discussed before, the volume of the activation command may be calculated by subtracting the sound pressure associated with the pre-processed digital signal from the sound pressure associated with the raw digital signal.

Processing device 102 executing voice-controlled assistant 108 may receive the stream of machine-readable symbols (e.g., alphabets and numbers) representing meaningful words of the voice commands from the speech-to-text application. Voice-controlled assistant 108 may analyze these words and identify the tasks requested by the user. Voice-controlled assistant 108 may further perform the requested tasks identified by the user (e.g., schedule a meeting or retrieve information from the Internet for the user), and generate a response to the user. In one implementation, the response may be in the form of machine-readable symbols in forms similar to the input to voice-controlled assistant 108. A processing device 218 may execute a voice response generator (e.g., a text-to-speech program) to convert the textual response into digital signals describing the sound wave of the response. The volume of the sound wave may be determined separately. In one implementation, processing device 102 may execute the output volume control application 110 to generate a target volume of the sound wave of the voice response. The target volume may be calculated based on the measurement of the loudness (e.g., via sound pressure measurement) of the background noise and the measurement of the loudness of the activation command both received from the sound pressure detector 210. The output volume should be above the background noise but lower than the loudness of the activation command.

Voice output interface 106 may include a digital-to-analog converter (DAC) 216, an amplifier 214, and a speaker 212 that are combined to convert the digital signals representing the voice response into sound. DAC 216 may convert the digital signals representing the voice response into analog signals representing the same. Amplifier 214 is an electronic device that can increase the power of the analog signals so that the analog signals are at a level appropriate for speaker 212 to convert the analog signals into sound of the voice responses. Amplifier 212 may include an input node 230 to receive a loudness parameter that determines the loudness of the voice responses and a sensor node 228 that may measure the loudness of the voice response.

In one implementation, the volume of the voice responses is set at a level that is no more than the detected sound pressure of the activation command. This can be achieved using a negative feedback loop including a regulator 220 and a circuit 232 to calculate the difference between the target volume and the loudness measured by sensor 228. The negative feedback loop may smooth the output volume and prevent random high volume output caused by spurious noise. As shown in FIG. 2, sensor node 228 may measure the loudness of the voice response generated by amplifier 212 and feed the measurement to a subtract circuit 232 that calculate the difference (e) between the measured loudness at amplifier 212 and the target volume from output volume control 110. The difference (e) may feed into a regulator 220 that may try to minimize the difference (e). Thus, the output volume may not exceed the target volume determined by output volume control 110.

In one implementation, regulator 220 may include a proportional-integral-derivative controller (PID controller) which may continuously calculate a combination of the proportional value, integral value, and differential value of the difference (e). The PID controller may continuously maintain the output volume not exceeding the target volume set by output volume control 110.

As discussed above, output volume control 110 may determine the target volume of the output voice response based on the loudness of the activation command. In one implementation, output volume control 110 may continuously monitor the sound pressure of voice commands subsequent to the initial activation command and adjust the target volume based on the sound pressure of these voice commands. Thus, the volume of the eventual voice response to the user may not exceed the loudness of the user's voice commands that may increase or decrease during the interaction with the voice-controlled assistant.

Figure 3:
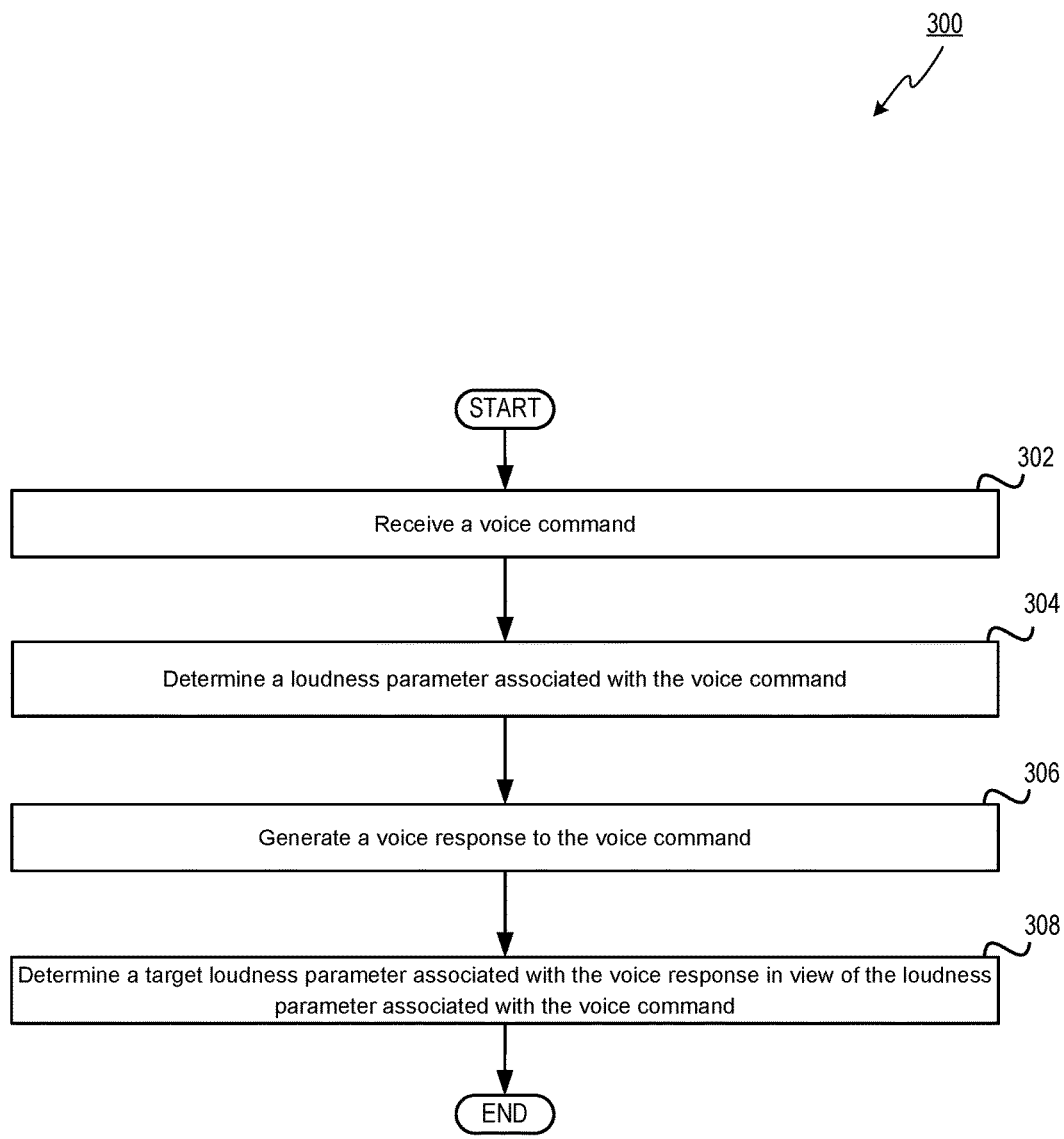
FIG. 3 depicts a flow diagram of a method to determine the volume of a voice response by a voice-controlled assistant according to an implementation of the present disclosure.

FIG. 3 depicts a flow diagram of a method 300 to determine the volume of a voice response by a voice-controlled assistant according to an implementation of the present disclosure. Method 300 may be performed by processing devices that may comprise hardware (e.g., circuitry, dedicated logic), computer readable instructions (e.g., run on a general purpose computer system or a dedicated machine), or a combination of both. Method 300 and each of its individual functions, routines, subroutines, or operations may be performed by one or more processors of the computer device executing the method. In certain implementations, method 300 may be performed by a single processing thread. Alternatively, method 300 may be performed by two or more processing threads, each thread executing one or more individual functions, routines, subroutines, or operations of the method.

Figure 4:
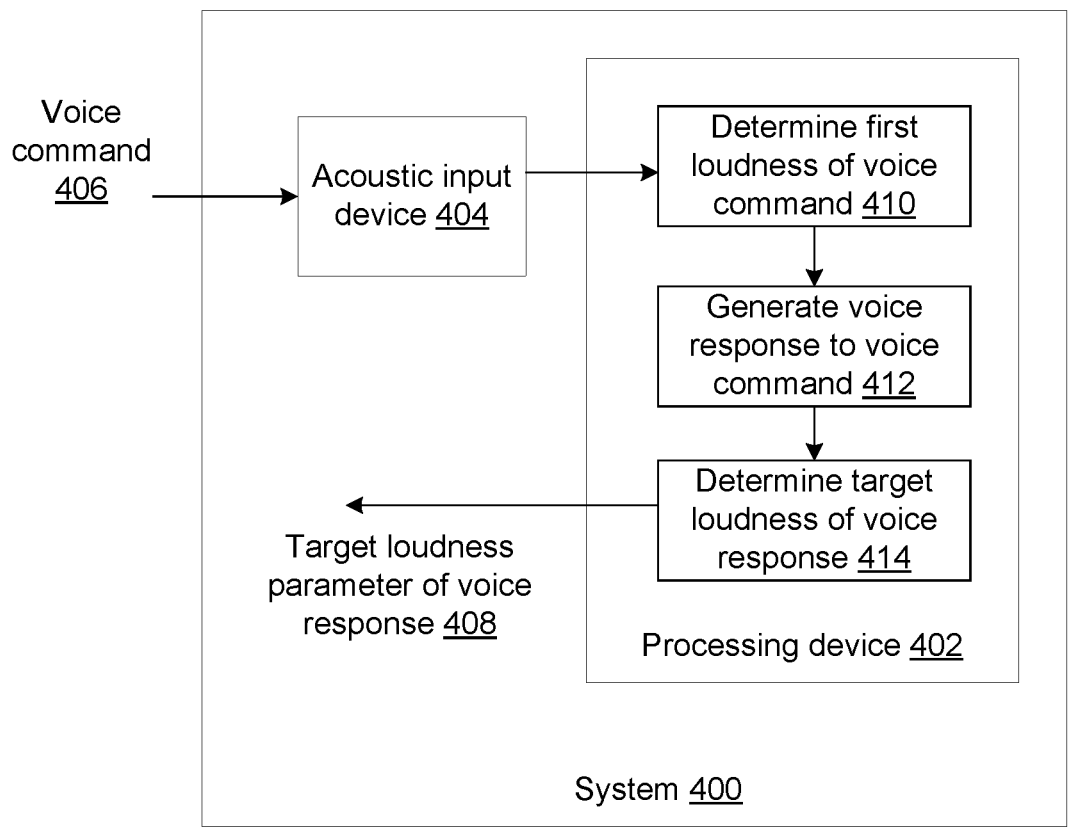
FIG. 4 illustrates a system to determine a target loudness according to an implementation of the present disclosure.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be needed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or storage media. In one implementation, method 300 may be performed by computing device 100 and processing device 102 as shown in FIGS. 1 and 2 or processing device 412 and system 410 as shown in FIG. 4.

Referring to FIG. 3, method 300 may be performed by processing devices of a computing device and may begin at block 302. At block 302, a processing device may receive a voice command that may include a request to perform tasks by a voice-controlled assistant running on the computing device.

At block 304, the processing device may determine a loudness parameter associated with the voice command. The loudness parameter may represent the volume of the voice command issued by a user to the voice-controlled assistant. The loudness parameter may be measured in terms of sound pressure caused by the voice command on a sensing element of a microphone of the computing device.

At block 306, the processing device may execute the voice-controlled assistant to perform the task requested by the user. Responsive to performing the task, the processing device may generate a voice response to the user.

At block 308, the processing device may determine a target loudness parameter associated with the voice response in view of the loudness parameter of the voice command. In one implementation, the processing device may determine the target loudness parameter is no higher than the loudness parameter of the voice command.

FIG. 4 illustrates a system 310 to determine a target loudness according to an implementation of the present disclosure. Referring to FIG. 4, system 410 may include a processing device 412 and an acoustic input device 414 communicatively coupled to processing device 412. Acoustic input device 412 may receive a voice command 416. Processing device 412 may determine a loudness parameter associated with the voice command 420, generate a voice response to the voice command 422, and determine a target loudness parameter 318 associated with the voice command 424.

Figure 5:
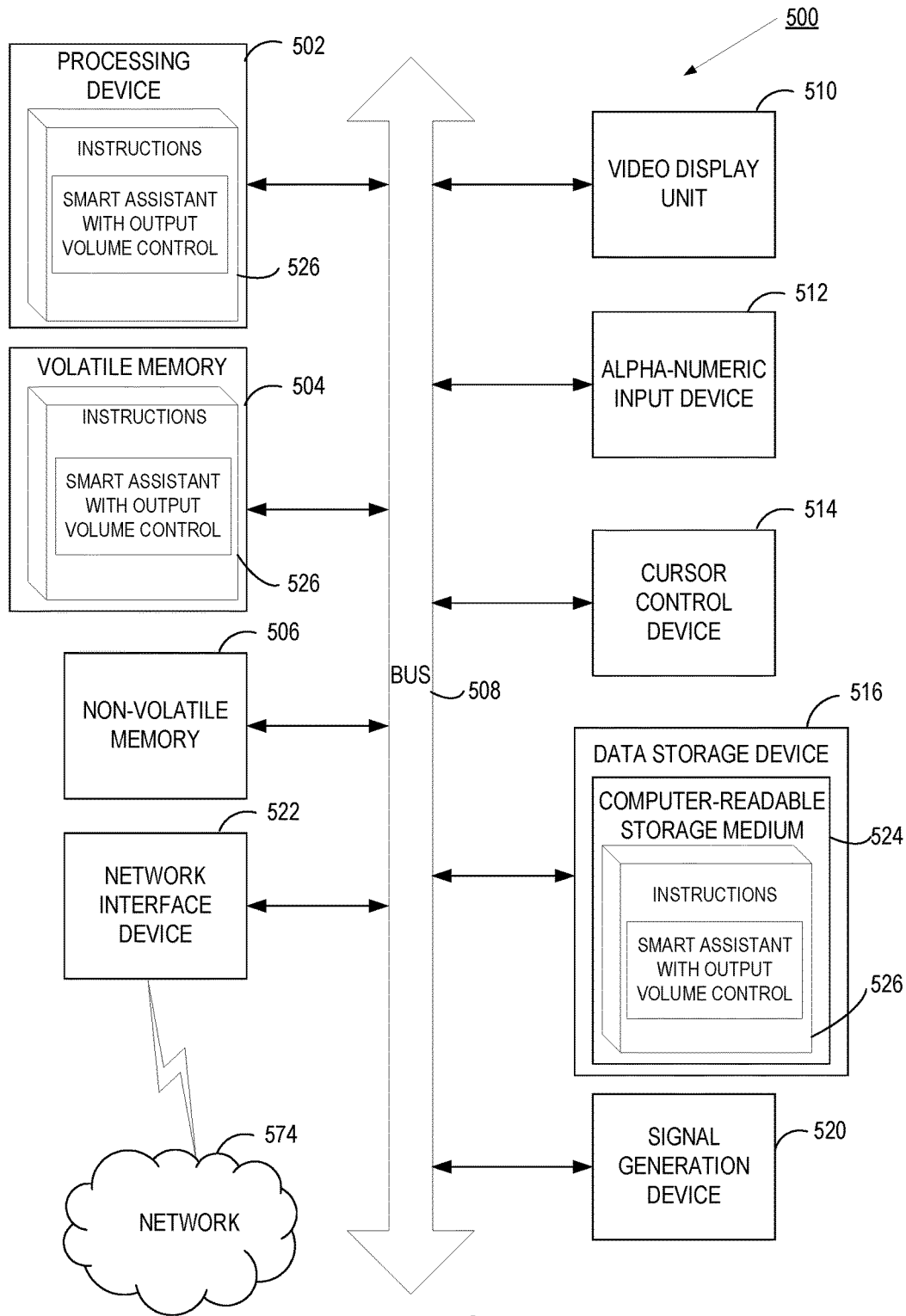
FIG. 5 depicts a block diagram of an illustrative computing device operating in accordance with the examples of the present disclosure.

FIG. 5 depicts a block diagram of a computer system operating in accordance with one or more aspects of the present disclosure. In various illustrative examples, computer system 400 may correspond to a computing device within system architecture 100 of FIG. 1, FIG. 2, and FIG. 4 respectively.

In certain implementations, computer system 500 may be connected (e.g., via a network, such as a Local Area Network (LAN), an intranet, an extranet, or the Internet) to other computer systems. Computer system 500 may operate in the capacity of a server or a client computer in a client-server environment, or as a peer computer in a peer-to-peer or distributed network environment. Computer system 500 may be provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 500 may include a processing device 502, a volatile memory 504 (e.g., random access memory (RAM)), a non-volatile memory 506 (e.g., read-only memory (ROM) or electrically-erasable programmable ROM (EEPROM)), and a data storage device 516, which may communicate with each other via a bus 508.

Processing device 502 may be provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 500 may further include a network interface device 522. Computer system 500 also may include a video display unit 510 (e.g., an LCD), an alpha-numeric input device 512 (e.g., a keyboard), a cursor control device 514 (e.g., a mouse), and a signal generation device 520.

Data storage device 516 may include a non-transitory computer-readable storage medium 524 on which may store instructions 426 encoding any one or more of the methods or functions described herein, including instructions encoding output volume control of FIG. 1 for implementing method 300.

Instructions 526 may also reside, completely or partially, within volatile memory 504 and/or within processing device 502 during execution thereof by computer system 500, hence, volatile memory 504 and processing device 502 may also constitute machine-readable storage media.

While computer-readable storage medium 524 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "associating," "deleting," "initiating," "marking," "generating," "recovering," "completing," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may comprise a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform method 300 and/or each of its individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method comprising:
   receiving a voice command;
   determining, by a processing device, a first loudness parameter associated with the voice command;
   determining a second loudness parameter associated with a background noise;
   generating a voice response to the voice command;
   determining a target loudness parameter associated with the voice response, wherein the target loudness parameter is less than the first loudness parameter and greater than the second loudness parameter, such that the target loudness parameter is greater than a noise level of the background noise and less than a noise level of the voice command;
   generating, by an acoustic signal output device, a sound signal of the voice response;
   determining a third loudness parameter of the sound signal generated by the acoustic signal output device;
   calculating a difference between the target loudness parameter and the third loudness parameter of the sound signal;
   regulating a volume of the sound signal in view of the difference using a proportional-integral-differential (PID) controller; and
   causing output of the sound signal of the voice response at the volume in view of the target loudness parameter and the difference.

2. The method of claim 1, wherein determining the target loudness parameter comprises determining the target loudness parameter at a level not exceeding the first loudness parameter associated with the voice command.

3. The method of claim 1, wherein the voice command is an activation command for a voice-controlled assistant application executing on the processing device.

4. The method of claim 1, wherein determining the first loudness parameter associated with the voice command comprises determining a sound pressure of the voice command received at an acoustic input device.

5. The method of claim 1, further comprising:
   converting the voice command into a natural language text;
   parsing the natural language text to identify a task requested by a user; and
   generating, by a voice-controlled assistant, the voice response in view of the task.

6. The method of claim 1, wherein the first loudness parameter is determined in view of a first sound pressure associated with the received voice command and wherein the second loudness parameter is determined in view of a second sound pressure associated with the background noise.

7. A system comprising:
   an acoustic signal input device to receive a voice command;
   a processing device, communicatively coupled to the acoustic signal input device, the processing device to:
      determine a first loudness parameter associated with the voice command;
      determine a second loudness parameter associated with a background noise;
      generate a voice response to the voice command;
      determine a target loudness parameter associated with the voice response, wherein the target loudness parameter is less than the first loudness parameter and greater than the second loudness parameter, such that the target loudness parameter is greater than a noise level of the background noise and less than a noise level of the voice command;
   an acoustic signal output device;
   a sensor to determine a third loudness parameter of a sound signal generated by the acoustic signal output device;
   a circuit to calculate a difference between the target loudness parameter and the third loudness parameter of the sound signal; and
   a proportional-integral-differential (PID) controller to regulate a volume of the sound signal in view of the difference, wherein the acoustic signal output device to generate the sound signal of the voice response in view of the target loudness parameter and the difference.

8. The system of claim 7, wherein to determine the target loudness parameter, the processing device is further to determine the target loudness parameter at a level not exceeding the first loudness parameter associated with the voice command.

9. The system of claim 7, wherein the processing device is further to:
   convert the voice command into a natural language text;
   parse the natural language text to identify a task requested by a user; and
   generate, by a voice-controlled assistant, the voice response in view of the task.

10. A computer-readable non-transitory medium stored thereon codes that, when executed by a processing device, cause the processing device to:
    receive a voice command;
    determine, by the processing device, a first loudness parameter associated with the voice command;

determine a second loudness parameter associated with a background noise;

generate a voice response to the voice command;

determine a target loudness parameter associated with the voice response, wherein the target loudness parameter is less than the first loudness parameter and greater than the second loudness parameter, such that the target loudness parameter is greater than a noise level of the background noise and less than a noise level of the voice command;

generate, by an acoustic signal output device, a sound signal of the voice response;

determine a third loudness parameter of the sound signal generated by the acoustic signal output device;

calculate a difference between the target loudness parameter and the third loudness parameter of the sound signal;

regulate a volume of the sound signal in view of the difference using a proportional-integral-differential (PID) controller; and cause output of the sound signal of the voice response at the volume in view of the target loudness parameter and the difference.

11. The computer-readable non-transitory medium of claim 10, wherein to determine the target loudness parameter, the processing device is further to determine the target loudness parameter at a level not exceeding the first loudness parameter associated with the voice command.

12. The computer-readable non-transitory medium of claim 10, wherein the voice command is an activation command for a voice-controlled assistant application executing on the processing device.

\* \* \* \* \*